INVENTORS.
CHARLES C. CONLEY
BY VICTOR J. TURK
Schramm, Kramer & Sturges
ATTORNEYS.

INVENTORS.
CHARLES C. CONLEY
BY VICTOR J. TURK
Schramm, Kramer & Sturges
ATTORNEYS.

CONDUCTING ELEMENT AND METHOD

Filed Feb. 7, 1963 3 Sheets-Sheet 3

INVENTORS.
CHARLES C. CONLEY
VICTOR J. TURK
BY
Schramm, Kramer & Sturges
ATTORNEYS.

United States Patent Office 3,220,897

Patented Nov. 30, 1965

3,220,897

CONDUCTING ELEMENT AND METHOD

Charles C. Conley, deceased, late of Rocky River, Ohio, by Esther S. Conley, executrix, 19520 Hilliard Road, Rocky River, Ohio; Victor J. Turk, 27120 Forestview Ave., Euclid 32, Ohio; and Harry V. Pochapsky, 29524 Fairway, Willowick, Ohio Filed Feb. 7, 1963, Ser. No. 257,046
7 Claims. (Cl. 148—34)

This invention relates to an improved electrical conducting element and a method for producing it.

The present application is a continuation-in-part of our co-pending application Serial No. 89,025, filed February 13, 1961, now abandoned.

Printed circuits are widely used in various electronic devices, such as, radios, television, electronic computers, etc. The electrical conductors thereof are frequently made of copper foil which is adhered to a resinous substrate having a high dielectric strength. Reinforcing means, such as glass fiber, paper webs, etc., may be disposed within the resinous body to improve the strength of the material. Adhesion of the conductor element to the non-conducting substrate is effected by a suitable resinous material generally characterized by high polarity and high resistivity. Even with the development of improved adhesives, adhesion of copper foil to resinous substrates has not been wholly satisfactory.

Experience has shown that adhesion can be improved only at the sacrifice of high resistivity in the adhesive.

We have found that copper foil, and especially copper foil having columnar grain structure, which has been electrolytically treated as hereinafter more particularly described, provides what we term a "nodularized" surface and is especially suited for use as the electrical conductor of a printed circuit laminate. In a composite laminar structure composed of such nodularized copper foil adhered to a resinous substrate, there appears to be a new coaction with the adhesive material employed resulting in a greatly improved laminate useful in making printed circuits and characterized by superior adhesion of the conductor to the substrate without decrease in the resistivity of the adhesive. The untreated copper foil may be either rolled foil or electrodeposited foil.

Briefly stated, then, this invention is in the provision of an electrical conducting element comprising a laminate of a copper foil, a resinous substrate and means coacting between the foil and substrate to adhere the foil to said substrate including a polar adhesive of high resistivity and a nodularized surface of said copper foil. Also provided is an improved nodularized copper foil and the method of making it. While such foil is particularly useful in making printed circuit elements, it may also be used to advantage in the construction of copper-lined vessels, e.g., caskets and grave vaults, and for use in architectural design and artistic representations.

Figure 1:
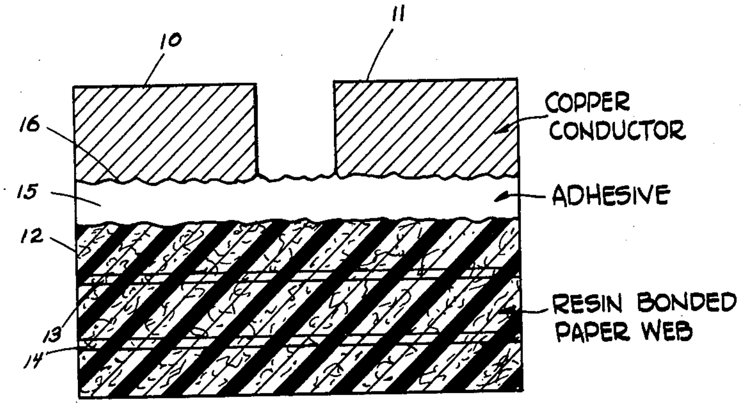
FIG. 1 is a cross-sectional view, much enlarged, of an improved laminar conducting element in accordance herewith.

Referring now more particularly to the annexed drawings, FIG. 1 is a cross-sectional view, much enlarged, of a printed circuit element showing two electrical conductor elements, 10 and 11, of copper foil produced in accordance herewith. Substrate 12 is a reinforced resinous body having paper webs 13 and 14 disposed therein. Coacting between the foil sections 10 and 11, is a thin layer of adhesive 15, which may be a phenol-nitrile adhesive. The "as plated" side 16, of the copper foil conductors 10 and 11 is nodularized in accordance herewith and the nodularized surface coacts with the adhesive 15 to produce a very strong bond to the substrate 12. The adhesive may be a high resistivity resinous material such as ethylene diamine cured epoxy resin, e.g., epichlorohydrin-2,2′-di-(p-hydroxyphenyl) propylidene condensation product (1:1) having an epoxy equivalence between 1 and 2. Any other low dielectric constant adhesive, e.g., poly (phenol-formaldehyde, vinyl butyral) may be used for securing the nodularized copper foil to the non-conductive substrate to provide an improved conducting element having improved adhesion of the copper foil to the substrate with an adhesive of high resistivity characteristics. The adhesive may also be a layer of heat and pressure-softened resin of the resinous substrate, or resin impregnated reinforcing web.

The effectiveness of an adhesive is measured in terms of the force in pounds required to separate a one-inch wide strip of metal foil from the substrate when pulled at an angle of 90° to the surface. Heretofore, with bare foil, 2–5 pounds per inch have been considered as maximum performance at 23° C. With our improved process we are able to obtain with conventional adhesives at 23° C., forces upwards of 10 pounds on 1 ounce foil and up to 17 pounds on 2 ounce foil, without sacrificing the high dielectric strength properties desired.

Conventional adhesives may be used to bond copper sheets to a resinous substrate, and improved adhesion due to the coaction between the adhesive and the nodularized surface will be found. For electrical purposes, low dielectric constant adhesives are selected. Among these are the various thermosetting and thermoplastic polymers and co-polymers, and mixtures thereof. A particularly satisfactory adhesive is composed of phenol-formaldehyde condensate and butadieneacrylonitrile rubber in a ratio of 90:10 and having 100 parts of wood flour admixed. This is a "phenolic-nitrile" adhesive currently used in the metal-non-metal adhesive field, particularly in printed circuits. Another adhesive currently used is a mixed poly(vinyl butyral-phenol-formaldehyde). Epoxy resins cured with various polyamine hardening agents are also used to adhere metals to non-metals and are characterized by satisfactory conductivity characteristics. Various alkyd resins, which are polyesters, may also be used as the adhesive, for example, a maleic anhydride-ethylene glycol polyester. Such polyesters dissolved in styrene, and copolymerized in place under heat with the addition of a small amount of a peroxide initiator provides an excellent adhesive.

Figure 2:
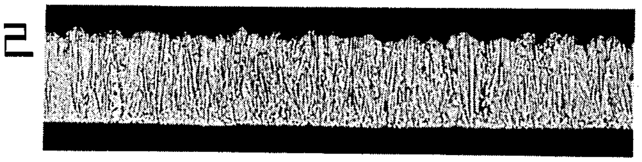
FIG. 2 is a photographic reproduction of an electronmicrograph showing a transverse section of electrodeposited copper foil.
Figure 3:
FIG. 3 is a photographic reproduction of an electronmicrograph showing the "as plated" surface of electrodeposited copper foil.

FIG. 2 shows a reproduction of a photomicrograph of a transverse section of an electrodeposited copper foil magnified several hundred diameters. FIG. 3 is a photographic reproduction of an electronmicrograph showing the "as plated" surface of electro-deposited copper foil. The "as plated" surface will be understood as identifying that surface of a copper body which is exposed to the electrode of opposite polarity in the electrodeposition bath.

This surface is clearly shown in FIG 2 and appears as the relatively rough surface which is characterized by promontories which are extensions of the grains or crystals of copper comprising the copper body. The opposite surface which is relatively smooth is that which is in contact with the electrically-charged plate or roll from which the copper foil is ultimately stripped. FIG. 2 clearly shows what is contemplated by the term "columnar grain structure." This structure is obtained in conventional copper foil-producing techniques by accurate control of the electrolyte bath composition, temperature, and the current density.

In one such commercial electrolytic procedure for producing copper foil, the electrolyte is composed of a solution of copper sulphate and sulphuric acid in water. Copper is present within the range of from 45 to 55 grams per liter calculated as the metal and the sulphuric acid content, calculated as 100% $H_2SO_4$, is within the range of from 90 to 110 grams per liter. In addition to these principal ingredients, a proteinaceous material, such as animal hide glue to control the nature of the deposition, is present in an amount maintained preferably between 2 to 3 p.p.m. Lignin sulphite is also added to the solution in a similar amount. The amounts of glue and lignin sulphite are controlled by visual examination of the surface of the copper foil and if desired by examination of a transverse section, e.g., FIG. 2, under a microscope. Under a magnification of 6000 diameters, the surface has the appearance of FIG. 3, and the section, the appearance of FIG. 2. The temperature of the foil-producing bath should be maintained at the highest level consistent with the production of good quality foil, i.e., having a surface such as shown in FIG. 3 and a substantially uniform thickness such as shown in FIG. 2. Particularly good results are obtained with bath temperatures in the range of about 105° F. to 110° F. A suitable current density has been found to be 160 amperes per square foot, with vigorous agitation of the bath.

While ordinary electrolytic foil producing techniques contemplate the use of a lead-surfaced drum, the surface of which is continuously burnished immediately upon stripping of the copper foil therefrom, better results are secured by utilizing a hardened chromium-surfaced drum on which all pits and irregularities have been substantially removed. Such a drum avoids the burnishing required of the lead-coated drum and enables, therefore, the production of a copper foil which is free of lead inclusions. Such copper foil is preferred for use in the production of printed circuits. The etching characteristics of copper are deleteriously affected by the presence of lead inclusions which are unavoidable in the lead drum process.

Substantially pure copper foil produced in the manner aforesaid has an "as plated" surface which is duller than the surface exposed to the drum-electrode and has a sheen similar in appearance to a very fine suede surface.

In the production of printed electrical circuits, copper is very much desired because of its high electrical conductivity. Where the copper foil is carefully made and contains minimum elemental impurities, e.g., lead, selenium, tellurium and phosphorus, the electrical conductivity is also very uniform over the extent of the electrical connection between two points. One class of substrate materials upon which the metallic foil is employed following the predetermined electrical circuit desired, is currently being made from laminated resin impregnated webs such as, for example, cellulosic or paper webs, or fiberglass webs. A resinous material which is highly satisfactory for this purpose because of its very low dielectric constant characteristics is a chemically hardened epoxy resin, e.g., an alkylene diamine cured condensation product of epichlorohydrin and 2,2'-di-(p-hydroxyphenyl) propylidene having an epoxy equivalence between 1 and 2. The production of ether resins is well known, and those skilled in the art are fully acquaintedwith the various types of ether resins which may be produced and used for the processes mentioned above.

The resinous substrates may be any of a wide variety of polymeric materials. Included among these are the aforementioned epoxy resins which may be fiberglass or paper reinforced, polymethylmethacrylate, resorcinol-formaldehyde, phenol-formaldehyde, poly(vinyl chloride-vinyl acetate), etc., with or without filler materials for reinforcing the resinous body. These materials will be selected in accordance with the end use. For electrical purposes, e.g., printed circuits for the more exacting requirements of computers we prefer the reinforced epoxy resins. One such resin reinforced with fiberglass has a dielectric strength of 310 volts/mil parallel and 445 volts/mil perpendicular; and a flexure strength of 63,200 p.s.i. The dielectric constant is 5.4. A paper reinforced phenol-formaldehyde, which is also very useful in electrical apparatus, has a dielectric strength of 495 volts/mil parallel and 545 volts/mil perpendicular; and a flexure strength of 18,800 p.s.i. The dielectric constant is 4.8. All measurements on a ⅛" thick sample.

The completion of a printed circuit unit contemplates according to one procedure the adhesion of sheets of bare copper foil to a non-metallic substrate of the type above described under heat and pressure, followed by etching to remove unwanted copper portions and leave the circuit conforming copper foil behind. In some instances, no additional adhesive material is necessary, the heat and pressure being sufficient to set the foil in adhered relation to the substrate. Even with the care exercised in preparing surfaces to aid adhesion of the metallic circuit to the substrate, the problem of securing such adhesion is complicated by many factors. Adhesives are known which will bond copper, for example, to laminated epoxy resin impregnated paper substrates with more than adequate adhesion insofar as industrial requirements are concerned. However, these powerful adhesives do not have the proper electrical resistivity properties and, hence, may not be used in many applications. Alternatively, adhesive which do possess desired electrical properties appear to be deficient in adhesive characteristics.

We have found that a nodularized surface and particularly a nodularized surface characterized by dendritic copper on copper foil coacts with an adhesive to provide very greatly improved initial and long-term adhesion to a non-metallic substrate. The copper foil may be rolled or electrodeposited. While either surface of electrodeposited or rolled copper foil may be beneficiated in accordance herewith, best results are secured on the "as plated" surface of electrodeposited foil having a columnar grain structure.

Figure 4:
FIG. 4 is a photographic reproduction of an electronmicrograph showing the "as plated" surface of electrodeposited copper foil having electrolytically deposited nodules of copper disposed on the promontories.
Figure 5:
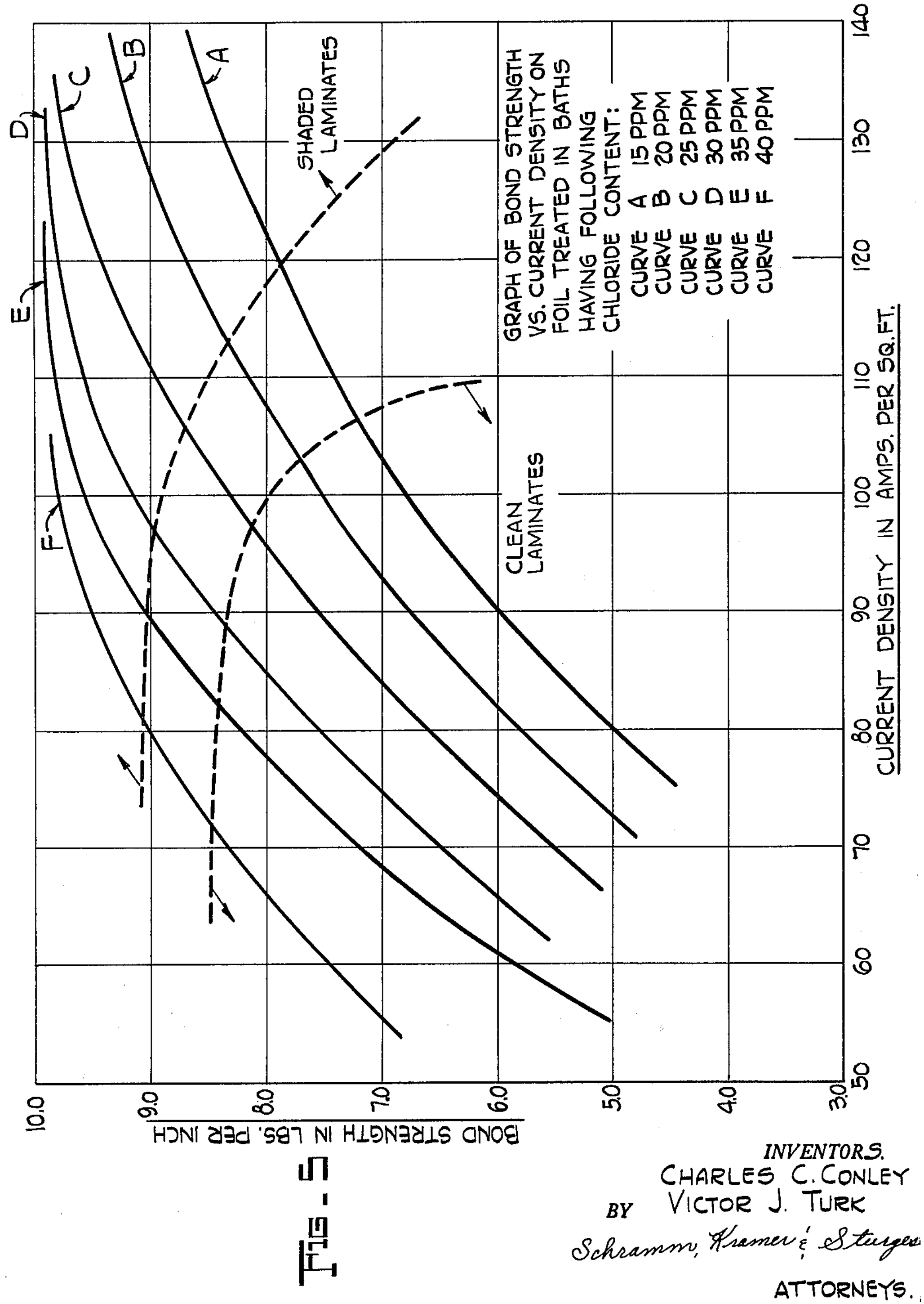
FIG. 5 is another photographic reproduction of an electronmicrograph showing the "as plated" surface of electrodeposited copper foil having electrolytically deposited nodules of copper disposed on the promontories.

As will be seen from FIGS. 4 and 5, the promontories, which are the ends of the columnar grains as seen from the "as plated" side, have been rendered highly irregular as compared with the surface shown in FIG. 3 by the provision on the summits and along the ridges of such promontories of nodules. These nodules are integrally connected to the copper grains and may be produced by a separate electrolytic process, hereinafter more particularly described. The most desirable nodular structure is characterized by myriad minute particles of dendritic copper attached to the copper surface which may have coated thereon oxides of copper, e.g., cuprous oxide with or without minor amounts of cupric oxide. These dendrites of copper become coated with oxide of copper as the freshly nodularized surface emerges form the nodularizing bath.

The extent of oxidation of this highly active form of copper is determined by rate of emergence, rapidity of washing, and use or non-use of corrosion inhibitors. Cuprous oxide is favored over the cupric form since the former is less sensitive to cyanide, a test which certain foils are required to pass. Stabilizers which preserve this form of oxide of copper are thus preferred where submission to reactive cyanide is contemplated.

The following electrolytic bath is exceptionally well adapted to the formation of nodules. A typical bath has an analysis in accordance with the following:

*Example I*

| | |
|---|---|
| NaCl, p.p.m. (calc. as Cl) | 32 |
| $CuSO_4.5H_2O$, grams per liter (calc. as Cu) | 23 |
| Sulphuric acid, grams per liter | 70 |
| Animal hide glue (low fat), gram per liter | 0.75 |
| Demineralized water | Balance |

Plating with a bath having a composition in accordance with Example I is preferably done at room temperature, i.e., from 70° to 80° F., a current density of 60–100 amperes per square foot and an exposure time of about 15 seconds. The copper foil is the cathode and an inert metal plate, e.g., lead, serves as the anode. Bond strengths ranging from 8 to 11 pounds per inch have been secured with baths having compositions according to the above example on glass fiber reinforced epoxy resin.

To promote the formation of more highly dendritic copper nodules, e.g., to provide a surface like that shown in FIG. 5, we prefer to use a plating bath having the following composition:

*Example II*

| | |
|---|---|
| $CuSO_4.5H_2O$, grams per liter (calc. as Cu) | 45 |
| $H_2SO_4$, grams per liter | 100 |
| Animal hide glue, gram per liter | 0.3 |
| NaCl, p.p.m. as Cl | 23 |
| Demineralized water | Balance |

Plating with this bath is preferably done at room temperature, i.e., a bath temperature of 70°–80° F., a current density of 100–110 amperes per square foot and an exposure time of 30 seconds. Additional exposure increases the formation of dendritic copper and improves adhesion, e.g., an exposure time of 45 seconds. The copper foil is the cathode and an inert metal plate, e.g., lead, serves as the anode.

For the more highly dendritic nodularized copper foil, formed from Example II above, bond strengths are generally of the order of 20%–30% higher on glass fiber filled epoxy resin than the nodularized foils of the type shown in FIG. 4 and using a bath composed as given in Example I above.

The plating baths useful in producing the nodularized copper foil of the present invention are of the non-leveling type, i.e., do not produce a smooth, shiny surface. In general, these baths have a composition according to the following:

| | |
|---|---|
| $CuSO_4.5H_2O$, saturation grams per liter | 20 |
| NaCl, 40 p.p.m. as Cl | 18 |
| $H_2SO_4$, 110 grams per liter | 65 |
| Animal hide glue, 1 gram per liter | 0.2 |
| Demineralized water | Balance |

In the above examples, the chloride ion may be derived from any water soluble chloride, such as an alkali metal chloride, e.g., sodium chloride, potassium chloride, lithium chloride or ammonium chloride. Instead of chloride ion, we may use any other halogen, such as bromide. The copper content of the bath is provided from copper sulphate. The glue may be replaced with any other water dispersible proteinaceous material, and materials such as peptone, blood albumin, gelatin, casein, egg albumin, etc. may also be employed. The amount of halogen in these baths is substantially above that which has been regarded as good practice in copper plating procedures. The current density is desirably carefully controlled to be within the range of from 60 to 125 amperes per square foot, and the bath temperature of the electrodeposition of the nodules is maintained at from 70°–80° F. Any suitable means for controlling the temperature of the bath may be employed, such as, for example, cooling coils immersed therein.

Figure 6:
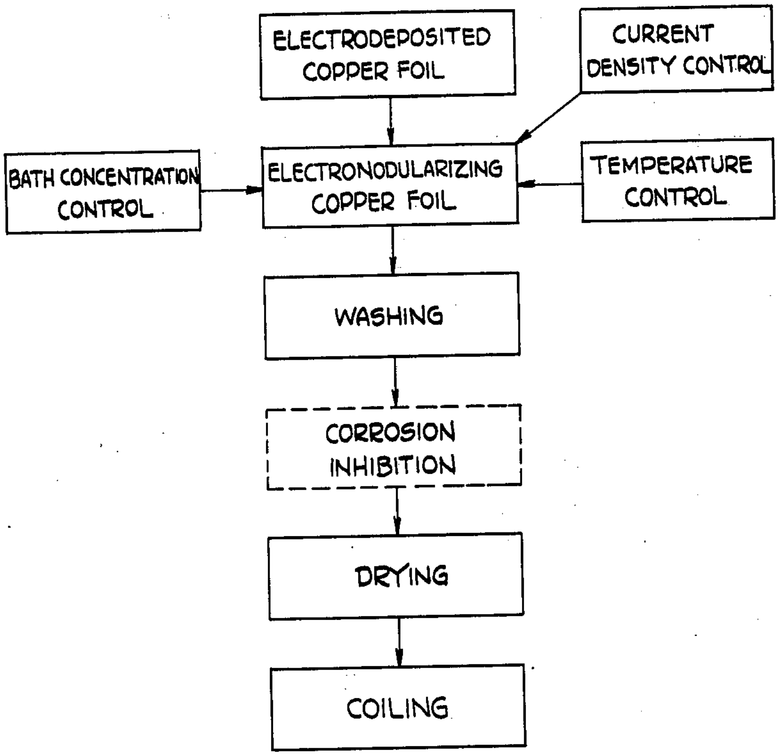
FIG. 6 is a flow sheet of a process by which the nodularized copper foil of this invention may be prepared.

In carrying on the electrochemical reaction resulting in the formation of the nodules, we prefer to use an insoluble anode, e.g., a lead plate, which is non-reactive with the bath. The copper foil serves as the cathode. The glue content of the treating bath is generally maintained between 0.2 and 1.0 gram per liter. Additions of glue are made on the basis of turbidimetric analyses regularly made each day. The chloride content is maintained between .018 and 0.04 gram per liter by additions of sodium chloride also based on turbidimetric analyses. Adjustment of chloride is preferably made twice each 8 hours of continuous operation. It is desirable also to circulate the treating bath slowly between the anode and the surface of the copper foil being treated at a rate, however, which is below that which can cause streaking of the surface. Foil travels through the bath at a rate of from 5 to 18 feet per minute and desirably at the rate of about 14 feet per minute and is exposed to the current for a period of from 10 to 60 seconds and preferably about 30 seconds. These conditions, it has been found, are productive of surfaces having substantially the appearance of FIG. 4. A flow sheet for this process is shown in FIG. 6.

It should be noted that in carrying out this electrochemical operation, conditions are employed which are outside those which are considered to be good electroplating practice with the resultant highly unexpected and beneficial effect upon adhesion of a copper foil so treated to a non-metallic substrate. Also, the plating conditions, including the composition of the bath, are clearly not conducive to the production of level surfaces, i.e., the conditions of plating are non-leveling conditions.

The manner in which bond strength measurements are made is as follows: A 6" square of copper foil of this invention is cemented to a 6" square of the resin and allowed to harden under influence of heat (302° F.) and pressure (1300 p.s.i.). Score lines 1" apart are struck across the surface penetrating through the copper foil. The edge of the 1" strip of copper foil is turned back by stripping from the surface a short distance, and clamped in a tensiometer. The tensiometer is so adapted and constructed as to exert a steady pull at right angles to the surface of the foil-resin-laminate providing a continuous reading in terms of pounds of pull per inch of width.

As indicated above, copper dendrites which may be coated with copper oxide are formed in the nodularizing process. The extent of dendritic formation on the surface of the nodularized copper foil affects adhesion as well as appearance of the composite laminate. Some of the dendritic formation, especially that produced at higher chloride ion levels, is easily broken off and appears as a powder. This powder is not completely removed by etching processes commonly employed in the manufacture of printed circuits and remains as a smudging on the surface of the resin. While for many purposes a smudged surface provides no cause for concern, oftentimes a clean appearance is important to salability. Generally, the heavier the dendritic copper formation, the better the adhesion.

Copper foil having a thickness of .0014" weighs about 1 ounce per square foot. We have found further that 2-ounce foil shows a higher peel strength than 1-ounce foil. Bare copper having the appearance of FIG. 3 and using an approved adhesive shows a bond strength of 2–3 pounds per inch of foil width for the 1 ounce per square foot foil using the "as plated" surface. With nodularized foils of the present invention characterized by an "as plated" surface as shown in FIG. 4, bond strengths ranging from about 10 to about 17 pounds per inch have been secured to foil weights of 1 and 2 ounces, respectively, per square foot.

Before storage and ultimate use of the foil, it has been found desirable to treat the foil with an anti-corrosion agent. After the electrolytic treatment and a washing operation to remove all traces of the bath, it has been found desirable to pass the foil strip through a corrosion inhibitor for copper. If the copper foil is to be used immediately, this step may be omitted. If, however, it is to be stored, transshipped and exposed to air, treatment with the corrosion inhibitor such as sodium salt of 1,2-benzotriazole will aid in preserving the surface. There will, however, be a slight loss in adhesion, e.g., on the order of ½ pound per inch. This optional step is shown in dotted lines in FIG. 6.

There has thus been provided an improved copper foil characterized by greatly improved adhesion characteristics. Products in accordance herewith whether from rolled copper foil or electrodeposited copper foil possess adhesion characteristics in excess of present standards. We believe that the improved adhesion is due for the most part to the presence of minute myriad nodules and dendrites of copper metal formed on the surface of the copper foil, and particularly on the summits and ridges of promontories on the "as plated" side of electrolytic copper foil. Improved conductivities and etching characteristics are secured when the copper foil is lead free, i.e., produced by a process which does not employ a lead-covered cathode drum.

Other modes of applying the principle of this invention may be employed instead of those specifically set forth above, changes being made as regards the details herein disclosed provided the elements set forth in any of the following claims, or the equivalent of such be employed.

It is, therefore, particularly pointed out and distinctly claimed as the invention:

1. The method of making nodularized copper foil which comprises the steps of exposing a copper foil as a cathode to a current density of from 60 a.s.f. to 125 a.s.f. for a period of from 10 to 60 seconds in an aqueous acidic copper sulphate bath containing from 18 to 40 p.p.m. of halogen ion, and from .2 to 1 gram per liter of water dispersible proteinaceous material.

2. The method of claim 1 in which the halogen ion is chloride.

3. The method of claim 1 in which the proteinaceous material is animal hide glue.

4. The method of making nodularized copper foil which comprises the steps of exposing electrodeposited copper foil having columnar grain structure as a cathode to a current density of from 60 a.s.f. to 125 a.s.f. for a period of from 10 to 60 seconds in an aqueous copper sulphate bath having a composition in accordance with the following:

| | |
|---|---|
| $CuSO_4.5H_2O$, g./l. to saturation as Cu | 20 |
| Alkali metal chloride, p.p.m. as chloride | 18–40 |
| $H_2SO_4$, g./l. | 65–110 |
| Water dispersible proteinaceous material, g./l. | 0.2–1 |
| Demineralized water | Balance |

and maintaining the temperature of said bath at from about 70° F. to about 80° F.

5. The method of making nodularized copper foil which comprises the steps of exposing electrodeposited copper foil having columnar grain structure as a cathode to a current density of from 60 a.s.f. to 100 a.s.f. for a period of from 10 to 60 seconds in an aqueous copper sulphate bath having a composition in accordance with the following:

| | |
|---|---|
| $CuSO_4.5H_2O$, g./l. as Cu | 23 |
| NaCl, p.p.m. as Cl | 32 |
| $H_2SO_4$, g./l. | 70 |
| Animal hide glue, g./l. | 0.75 |
| Demineralized water | Balance |

and maintaining the temperature of said bath at from about 70° F. to about 80° F.

6. The method of making nodularized copper foil which comprises the steps of exposing electrodeposited copper foil having columnar grain structure as a cathode to a current density of from about 100 a.s.f. to about 110 a.s.f. for a period of from 10 to 60 seconds in an aqueous copper sulphate bath having a composition in accordance with the following:

| | |
|---|---|
| $CuSO_4.5H_2O$, g./l. as Cu | 45 |
| NaCl, p.p.m. as chloride | 23 |
| $H_2SO_4$, g./l. | 100 |
| Animal hide glue, g./l. | 0.3 |
| Demineralized water | Balance |

and maintaining the temperature of said bath at from about 70° F. to about 80° F.

7. A nodularized copper foil produced in accordance with the method of claim 6.

References Cited by the Examiner

UNITED STATES PATENTS

| | | | |
|---|---|---|---|
| Re. 24,253 | 12/1956 | Beaver | 204—52 |
| 1,544,726 | 7/1925 | Colcord | 204—108 |
| 2,884,161 | 4/1959 | Hurd et al. | 154—43 |

FOREIGN PATENTS

| | | |
|---|---|---|
| 562,580 | 5/1957 | Italy. |

OTHER REFERENCES

Principles of Electroplating and Electroforming, 3rd ed., 1949, by Blum and Hogaboom, McGraw-Hill Book Co., Inc., pp. 67 and 292.

EARL M. BERGERT, *Primary Examiner.*